CONNECTION POST INTEGRATION FOR PRINTED CIRCUIT SYSTEMS

Filed June 2, 1964 2 Sheets-Sheet 1

INVENTORS
JOHN R. BEDELL
GEORGE MESSNER
BY
MORGAN, FINNEGAN, DURHAM & PINE
ATTORNEYS

INVENTORS
JOHN R. BEDELL
GEORGE MESSNER
BY
MORGAN, FINNEGAN, DURHAM & PINE
ATTORNEYS

United States Patent Office 3,322,880

Patented May 30, 1967

3,322,880

CONNECTION POST INTEGRATION FOR PRINTED CIRCUIT SYSTEMS

John R. Bedell, Smithtown, and George Messner, Sea Cliff, N.Y., assignors to Photocircuits Corporation, Glen Cove, N.Y., a corporation of New York Filed June 2, 1964, Ser. No. 372,012
4 Claims. (Cl. 174—68.5)

This invention relates to printed circuit systems and to a method of manufacturing such systems which improves electrical connections to single layer printed circuit boards and the internal circuitry of multilayer printed circuit boards, and which improves the internal circuit connections themselves by providing and incorporating within the board system a series of terminal posts which also extend outside the system and which are connected to the internal circuitry of the system by through-plating. connections produced in accordance with the invention result in strong, reliable, and economical external post connections to printed circuit boards and to the internal circuitry of multilayer printed circuit board systems, as well as providing secure circuit connections within the system itself.

As used in this specification, the term "plated-through hole" refers to its commonly accepted meaning in the printed circuit industry, i.e. a hole passing through, or partially through, a printed circuit board on the surface of which an adherent film of copper has been deposited or formed and which is integral with the printed circuit conductors or one or both faces of the plate or plates of the printed circuit board.

A common shortcoming in existing single and multilayer circuits has been the lack of obtaining and maintaining stable and reliable electrical power source connections to the internal circuitry of the system.

It is therefore an object of this invention to provide stable and positive conductance entirely throughout single or multilayer printed circuit board systems.

Another object of this invention is to produce stable, positive, and reliable electrical connections leading into the internal circuit conductors of multilayer printed circuit board systems.

Another object of this invention is to provide an economic and inexpensive, yet solid and stable method of connecting the terminal posts of a single or multilayer circuit board system to an electrical power source.

Additional objects and advantages of the invention will be set forth in the description which follows, and in part will be obvious from the description, or may be learned by practice of the invention, the objects and advantages being realized and attained by means of the steps, processes, instrumentalities and combinations particularly pointed out in the appended claims.

Briefly described, the present invention is characterized by a novel article of manufacture and method for its production, the article having posts extending from the surface of single or multilayer printed circuit boards and connected to the circuitry of the boards by means of the through-plating material of the through-hole connections. The novel method comprises forming terminal posts having one end thereof disc or tab-shaped, securing the posts within a single printed circuit board or multiple boards laminated together, drilling through-holes in the board or boards parallel to the legs of the terminal posts and passing through the disc or tab-shaped portions thereof, and plating the through-holes. The resulting printed circuit system has the printed circuits and terminal posts electrically connected by the through-hole plating in the same manner as the plated-through hole is connected to the printed circuitry.

The accompanying drawings, referred to herein and constituting a part hereof, illustrate the steps, processes, instrumentalities and combinations of the invention, and together with the description, serve to explain the principles of the invention. It will be understood that the drawings are not to scale but have been enlarged for ease of illustration and understanding of the invention.

Figure 1:
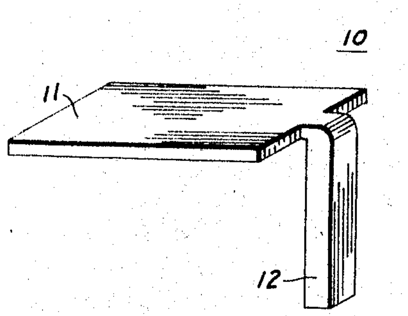
FIGURES 1 to 3 illustrate in isometric view alternate embodiments of a terminal post in accordance with the invention.

With reference to the drawings, FIGURE 1 illustrates, in accordance with the invention, a terminal post 10 having a flattened, rectangular-shaped tab or disc 11 which is perpendicularly situated to the extending post 12.

Figure 2:
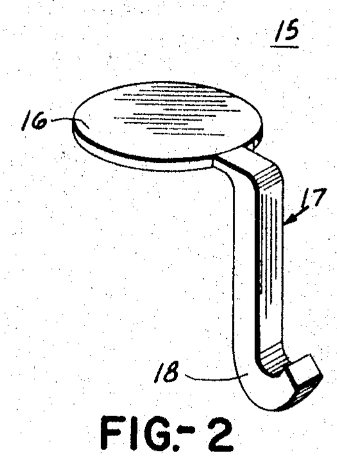
Figure 3:
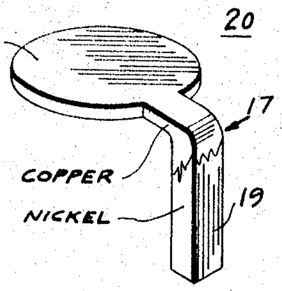

Alternate embodiments of the terminal post are illustrated in FIGURES 2 and 3. Thus, in FIGURE 2, there is shown a terminal post 15 having a formed, rounded tab or disc 16, an extending post 17, and, at the extremity of the post, an arc or semi-circular-shaped portion 18, which has been formed to facilitate connection of the extremity of the post to an electrical power source by welding, soldering, wire-wrapping, etc. Other modifications in the terminal post will be apparent to those skilled in the art, e.g., a conventional plug-type extension may be formed on the terminal post.

The alternate embodiment of the terminal post 20, shown in FIGURE 3, is similar to that shown in FIGURE 2, with the exception that it is formed of a combination of materials, which facilitate electroplating the post with copper at the tab end 16 while permitting the extension post 17 to be welded. Thus, for example, the terminal post 20 may be plated with nickel at 19 to permit welding thereto, while tab end 16 is plated with copper.

A variety of methods may be used to produce the post components. They may be forged, trimmed and the extending post bent until it is perpendicular to the face of the flattened head; or, they may be formed by welding wire perpendicularly to the plane of the face of a tab; or, they may be formed by slotting or cutting sheet metal and then forming the tab and the extending post. As illustrated in FIGURE 2, the extremity of the extending post may also be shaped into an arc or semi-circle in order to facilitate welded or soldered connections thereto.

In the embodiment of FIGURE 3, it will be understood that any material or any combination of materials which are suitable for electroplating with copper on one end and a welded connection at the other end may be used. A material preferred for use at the extremities of the terminal posts and which is readily adaptable to making welded connections is nickel.

Once the post components have been shaped and formed, they are inserted into a printed circuit system wherein one of the layers of the system has been pre-slotted or punched to accommodate only the flattened tab or disc of the post component while the remaining layers of the system are pre-slotted, or punched to accommodate only the post extensions or pins of the post components. Either single layer circuitry or as many printed circuit layers as are desired or required in a multilayer system may be used in accordance with the invention providing the layers used have been prepared to accept the post components in the manner described above. The post components are so constructed that a portion of the post protrudes beyond the face of the bottom or outer-most layer of the completely assembled multilayer system.

Figure 4:
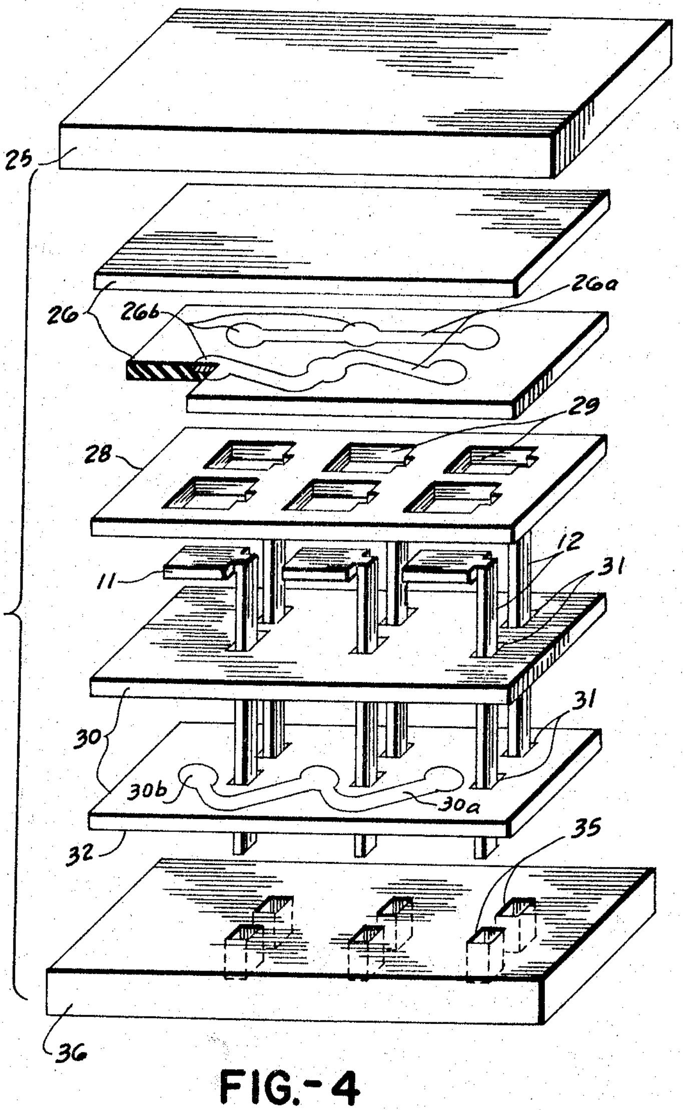
FIGURE 4 is an isometric view of a multilayer printed circuit board with the terminal posts positioned in the system prior to assembly and lamination.

FIGURE 4 is an isometric view illustrating the assembly of a multilayer printed circuit board system with the post components shown in FIGURE 1 prior to lamination. Reference numeral 25 designates the protective top platen, 26 locates printed circuit boards which have not been pre-slotted or punched to accept the post components, 28 is the printed circuit board which has been pre-slotted or punched at 29 to accommodate the tabs 11 of the post components 10, while 30 locates the multiple layers of the printed circuit system which have been pre-slotted or punched at 31 to accommodate the posts 12, positioned in the assembled system so that a portion of the posts extends beyond the outer face of the bottom-most layer 32 of the system, while the leg protrusions are accommodated by the recesses 35 in the protective bottom platen 36 during lamination of the board assembly, more fully discussed hereinbelow.

Each of boards 26 and 30 have circuit patterns thereon such as are commonly used in printed circuitry, e.g., strips of conductors 26*a*, 30*a* between respective pads of conductive material 26*b*, 30*b*. Other associated circuit components may be affixed to each of the circuit boards as will be understood by those skilled in the art.

Figure 5:
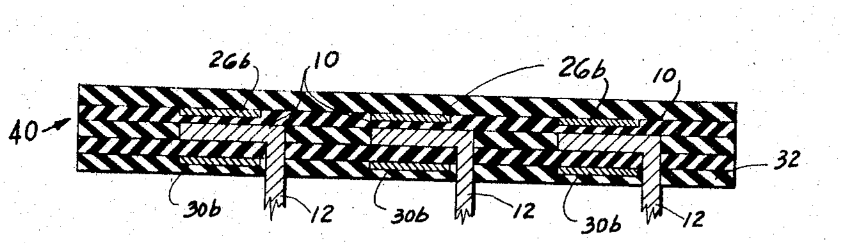
FIGURE 5 illustrates in longitudinal sectional view the assembled and laminated multilayer board of FIGURE 4.

The completed laminated multilayer board assembly 40, with the post components 10 firmly embedded therein with their extending posts 12 protruding from the bottom-most layer 32 of the laminated assembly is shown in FIGURE 5.

Lamination may be accomplished by subjecting the assembled multilayer system to heat and pressure or by any other suitable method.

Figure 6:
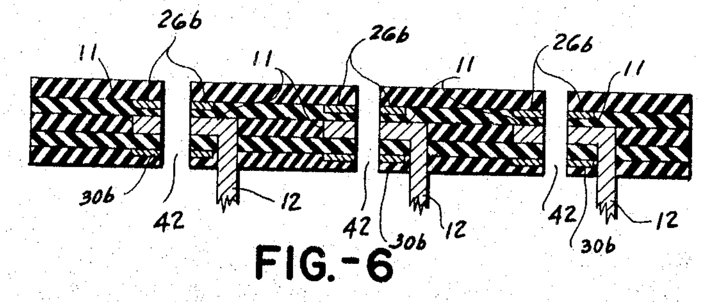
FIGURES 6 and 7 illustrate, in longitudinal sectional view, the steps of drilling and plating through-hole connections in the terminal posts and circuit board structure of the assembled board of FIGURE 5.

The post components are located in the pre-punched and slotted circuit boards in predetermined positions whereby through-hole connections between the surfaces of a single printed circuit board, or between multiple boards, may be made. Once lamination is completed, through-holes 42 are drilled through the system (FIGURE 6) in a plane parallel to the legs 12 of the post components and passing through the tabs or discs 11 of the post components in a plane perpendicular to the face thereof.

After the through-holes have been drilled in this manner, the entire board system is metalized in accordance with methods commonly known and used in the art. The extending legs of the post components and exterior surfaces are then masked by dipping the assembled system or portions thereof into a suitable resist. Alternatively, the posts and preferred regions of the exterior surfaces may be masked by flow coating.

Plating of the through-holes follows and may be accomplished by any one of the methods well known in the art such as electroplating, electroless plating, etching, and so forth. While any conductive metal may be used for plating, copper is preferred in the embodiment of this invention.

Figures 7, 8:
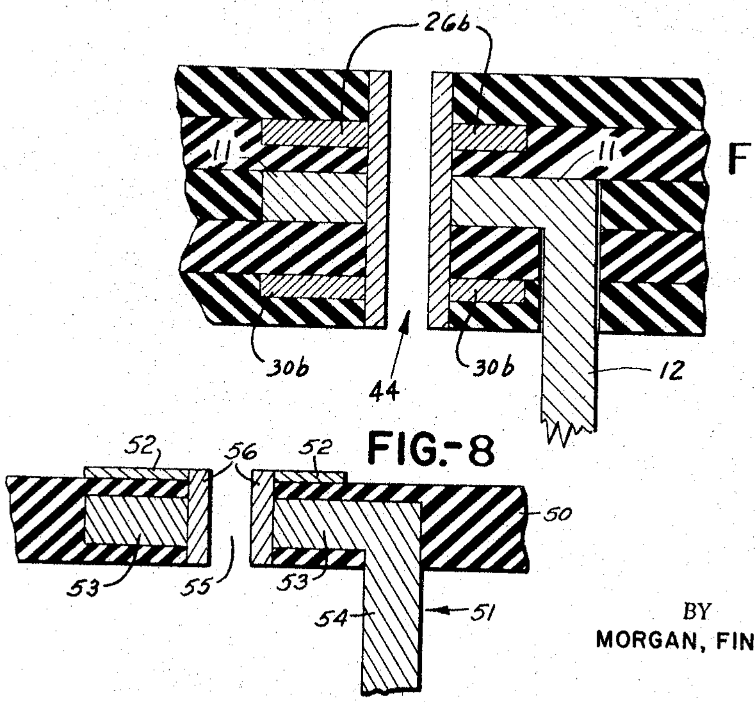
FIGURE 8 is an enlarged, fragmentary, longitudinal, sectional, view of a single layer printed circuit board having a terminal post integral therewith and a printed circuit conductor pattern on one surface, illustrating a plated-through connection between the printed circuit conductor pattern and the terminal post.

After plating, the resist coating and copper on the terminal posts and the masked exterior surfaces are removed; a typical plated-through hole 44 of the resulting assembled circuit board system is shown in FIGURE 7. It will be seen that the circuit board system is equipped with its own integrated electrical connections which may now be made between the terminal posts and the circuitry within the multilayer board system, through the plated-through holes.

Referring now more particularly to FIGURE 8 of the accompanying drawings, there is shown an insulative plate 50, forming a single layer printed circuit board, having a terminal post, indicated generally by reference numeral 51, mounted integral therewith and a printed circuit conductor pattern 52 applied to one surface thereof. Terminal post 51 may be in the form of any one of the embodiments previously described and includes a first portion 53 mounted substantially parallel to the surface of plate 50, and a second portion 54 adapted to be externally, electrically connected, as previously described. A through hole 55 passes through the printed circuit pattern and portion 53 of the terminal post and is plated-through at 56, all in the manner previously described.

It will be understood that terminal post 51 is mounted integrally with the printed circuit board 50 in the same manner as described for a multilayer board and that the plated-through hole is likewise drilled and plated in a manner as previously described. The printed circuit pattern may be applied to opposed surfaces of the insulative plate; it may include various associated circuit components; and the post components and plated-through holes may be located in desired, predetermined positions, all as will be apparent to those of ordinary skill in the art.

The invention in its broader aspects is not limited to the specific steps, procedures, embodiments, instrumentalities and combinations herein shown and described but departures may be made therefrom within the scope of the accompanying claims without departing from the principles of the invention and without sacrificing its chief advantages.

What is claimed is:

1. A printed circuit board comprising an insulative plate having opposed surfaces adapted to receive printed circuit conductors thereon, said board having a printed circuit conductor pattern on at least one of said opposed surfaces, at least one terminal post mounted integral with said board having a portion thereof extending at least to one of said opposed surfaces for external electrical connections, and at least one plated-through hole passing through a portion of said terminal post and said printed circuit conductors, said plated-through hole thereby electrically interconnecting said printed circuit conductors and said terminal post.

2. A multilayer printed circuit board comprising a plurality of insulative plates each having opposed surfaces adapted to receive printed circuit conductors thereon, said board having a printed circuit conductor pattern on at least one of the plurality of opposed surfaces, at least one terminal post mounted integral with said board having a portion thereof extending at least to an outer one of said opposed surfaces for external electrical connections, and at least one plated-through hole passing through a portion of said terminal post and said printed circuit conductors, said plated-through hole thereby electrically interconnecting said printed circuit conductors and said terminal post.

3. A printed circuit board comprising an insulative plate having printed circuit conductors on at least one surface thereof, at least one terminal post mounted integral with said board, said terminal post including a first portion mounted substantially parallel to the surface of said plate carrying said printed circuit conductors and a second portion for external electrical connections, and at least one plated-through hole passing through said first portion of said terminal post and said printed circuit conductors, said plated-through hole thereby electrically interconnecting said printed circuit conductors and said terminal post.

4. A multilayer printed circuit board comprising a plurality of insulative plates having printed circuit conductors on the surfaces thereof, at least one terminal post mounted integral with said board, said terminal post including a first portion mounted substantially parallel to the surfaces of said plates carrying said printed circuit conductors and a second portion for external electrical connections, and at least one plated-through hole passing through said first portion of said terminal post and said printed circuit conductors, said plated-through hole thereby electrically interconnecting said printed circuit conductors and said terminal post.

References Cited

UNITED STATES PATENTS

| | | | |
|---|---|---|---|
| 2,502,291 | 3/1950 | Taylor. | |
| 2,915,678 | 12/1959 | Frazier et al. | 174—68.5 X |
| 3,102,213 | 8/1963 | Bedson et al. | 174—68.5 |
| 3,151,278 | 9/1964 | Elarde | 174—52 X |

DARRELL L. CLAY, *Primary Examiner.*

L. H. MYERS, *Examiner.*